(12) United States Patent
Cairns (10) Patent No.: US 10,505,180 B2
(45) Date of Patent: Dec. 10, 2019

(54) CORE-SHELL STRUCTURED NANOPARTICLES FOR LITHIUM-SULFUR CELLS

(71) Applicant: THE REGENTS OF THE UNIVERSITY OF CALIFORNIA, Oakland, CA (US)

(72) Inventor: Elton J. Cairns, Walnut Creek, CA (US)

(73) Assignee: THE REGENTS OF THE UNIVERSITY OF CALIFORNIA, Oakland, CA (US)

(*) Notice: Subject to any disclaimer, the term of this patent is extended or adjusted under 35 U.S.C. 154(b) by 24 days.

(21) Appl. No.: 14/440,962

(22) PCT Filed: Mar. 15, 2013

(86) PCT No.: PCT/US2013/032504
§ 371 (c)(1),
(2) Date: May 6, 2015

(87) PCT Pub. No.: WO2014/074150
PCT Pub. Date: May 15, 2014

(65) Prior Publication Data
US 2015/0311508 A1    Oct. 29, 2015

Related U.S. Application Data

(60) Provisional application No. 61/723,619, filed on Nov. 7, 2012.

(51) Int. Cl.
*H01M 4/36*    (2006.01)
*H01M 4/136*   (2010.01)
(Continued)

(52) U.S. Cl.
CPC ......... *H01M 4/366* (2013.01); *C23C 16/4417* (2013.01); *H01B 1/122* (2013.01);
(Continued)

(58) Field of Classification Search
CPC .... H01M 4/133; H01M 4/136; H01M 4/5815; H01M 4/1397; H01M 4/587
See application file for complete search history.

(56) References Cited

U.S. PATENT DOCUMENTS

2009/0317557 A1 * 12/2009 Luhrs .................. B01J 2/006
427/455
2011/0200883 A1 * 8/2011 Cui ..................... H01M 4/049
429/231.4
(Continued)

FOREIGN PATENT DOCUMENTS

JP          09293516 A  * 11/1997
WO    WO-2012071916 A1 *  6/2012  ............ H01M 4/362

OTHER PUBLICATIONS

Materials Safety Data Sheet, Lithium Sufide, Lorad Chemical Corporation.*
(Continued)

*Primary Examiner* — Eric R Smith
(74) *Attorney, Agent, or Firm* — Womble Bond Dickinson (US) LLP; Daniel E. Ovanezian (57) ABSTRACT

Described is a core-shell nanoparticle comprising a lithium sulfide nanoparticle core and a shell covering the lithium sulfide nanoparticle core, the shell comprising at least one of carbon, polyanaline or a transition metal sulfide. The core-shell nanoparticle may be used for a positive electrode in a lithium/sulfur battery cell.

7 Claims, 11 Drawing Sheets

(51) Int. Cl.
    *H01M 4/1397*     (2010.01)
    *H01M 4/58*     (2010.01)
    *H01M 10/052*     (2010.01)
    *H01B 1/12*     (2006.01)
    *H01M 4/04*     (2006.01)
    *C23C 16/44*     (2006.01)
    *H01M 4/131*     (2010.01)
    *H01M 4/133*     (2010.01)
    *H01M 4/137*     (2010.01)
    *H01M 4/485*     (2010.01)
    *H01M 4/587*     (2010.01)
    *H01M 4/62*     (2006.01)
    *H01M 10/0525*     (2010.01)
    *H01M 10/0569*     (2010.01)
    *H01M 4/02*     (2006.01)

(52) U.S. Cl.
    CPC ....... *H01M 4/0402* (2013.01); *H01M 4/0428* (2013.01); *H01M 4/0471* (2013.01); *H01M 4/131* (2013.01); *H01M 4/133* (2013.01); *H01M 4/136* (2013.01); *H01M 4/137* (2013.01); *H01M 4/1397* (2013.01); *H01M 4/485* (2013.01); *H01M 4/587* (2013.01); *H01M 4/5815* (2013.01); *H01M 4/622* (2013.01); *H01M 10/0525* (2013.01); *H01M 10/0569* (2013.01); *H01M 10/052* (2013.01); *H01M 2004/028* (2013.01); *H01M 2300/0028* (2013.01)

(56) References Cited

U.S. PATENT DOCUMENTS

2013/0065128 A1*   3/2013   Li ............ H01M 4/136
                                          429/218.1
2013/0224594 A1*   8/2013   Yushin ........ H01M 4/366
                                          429/218.1
2013/0295469 A1*  11/2013   Liang ......... H01M 4/134
                                             429/335

OTHER PUBLICATIONS

Safety Data Sheet, Lithium Sulfide, Alfa Aesar.*
Machine translation of JP09293516A.*
G. W. Walker, C. P. Walters, P. E. Richardson, "Hydrophobic effects of sulfur and xanthate on metal and mineral surfaces", International Journal of Mineral Processing 18, p. 119-137 (Year: 1986).*

* cited by examiner

CORE-SHELL STRUCTURED NANOPARTICLES FOR LITHIUM-SULFUR CELLS

RELATED APPLICATIONS

This application claims priority to PCT Application PCT/US2013/032504, filed Mar. 15, 2013, which in turn claims priority to U.S. Provisional Patent Application No. 61/723,619, filed Nov. 7, 2012, which is herein incorporated by reference.

STATEMENT OF GOVERNMENTAL SUPPORT

The invention described and claimed herein was made in part utilizing funds supplied by the U.S. Department of Energy under Contract No. DE-AC02-05CH11231 between the U.S. Department of Energy and the Regents of the University of California for the management and operation of the Lawrence Berkeley National Laboratory. The government has certain rights in this invention.

TECHNICAL FIELD

The present invention relates to the field of battery cells, and more particularly to core-shell nanoparticles for use in lithium/sulfur battery cells.

BACKGROUND

There is considerable interest in the development of lithium/sulfur (Li/S) cells. However, major challenges in the development of Li/S cells have yet to be addressed including a short cycle life due to loss of capacity. The short cycle life of Li/S cells is generally caused by the formation of polysulfides, which are soluble in organic electrolytes. Various approaches have been explored to improve the short cycle life. These include putting the sulfur into a porous carbon structure, reacting the sulfur with a polymer, adsorbing the sulfur onto a substrate such as carbon or silica, etc. However, such approaches have to date failed to appreciably improve the short cycle life of Li/S cells.

DETAILED DESCRIPTION

Described herein are embodiments of a core-shell nanoparticle that includes a lithium sulfide core with a shell that conducts electrons and lithium ions. Also described herein are a lithium/sulfur (Li/S) cell including the core-shell nanoparticles. When the core-shell nanoparticles are used in a Li/S battery cell, the shell inhibits polysulfides from developing or coming into contact with the electrolyte, and thus increases the lifespan of the cell. For example, traditional Li/S cells typically do not hold an appreciable charge after around a few tens of cycles. In contrast, Li/S cells manufactured using the core-shell nanoparticles described in embodiments of the present invention continue to hold an appreciable charge after hundreds of cycles.

Also described herein are processes to synthesize core-shell nanoparticles and processes to manufacture Li/S cells from the core-shell nanoparticles. To synthesize the core-shell nanoparticles, carbon, polyaniline or transition metal sulfide shells are formed around lithium sulfide ($Li_2S$) nanoparticles. Polyaniline shells may be formed around the $Li_2S$ nanoparticles by mixing the $Li_2S$ nanoparticles with a polymer in an organic polar solvent, and then evaporating the solvent. The resultant core-shell nanoparticles may then be heated to convert the polyaniline shells into carbon shells. Carbon shells may also be formed by performing a chemical vapor deposition (CVD) process using an oxygen-free organic vapor that does not yield water as a decomposition product. Transition metal sulfide shells may be formed, for example, by reacting the $Li_2S$ nanoparticles with titanium tetrachloride to form titanium disulfide shells.

To manufacture an Li/S cell using the core-shell nanoparticles, a slurry or solution that includes core-shell nanoparticles, an organic solvent and a polymer binder is created. The slurry is then used to coat an electrical conductor such as a conductive foil to form a positive electrode. A Li/S cell is then formed using the positive electrode, a negative electrode and an electrolyte that separates the two electrodes. The electrolyte may be a solid electrolyte or may be a liquid electrolyte. If a liquid electrolyte is used, it may be held in the pores of a porous separator.

Figure 1:
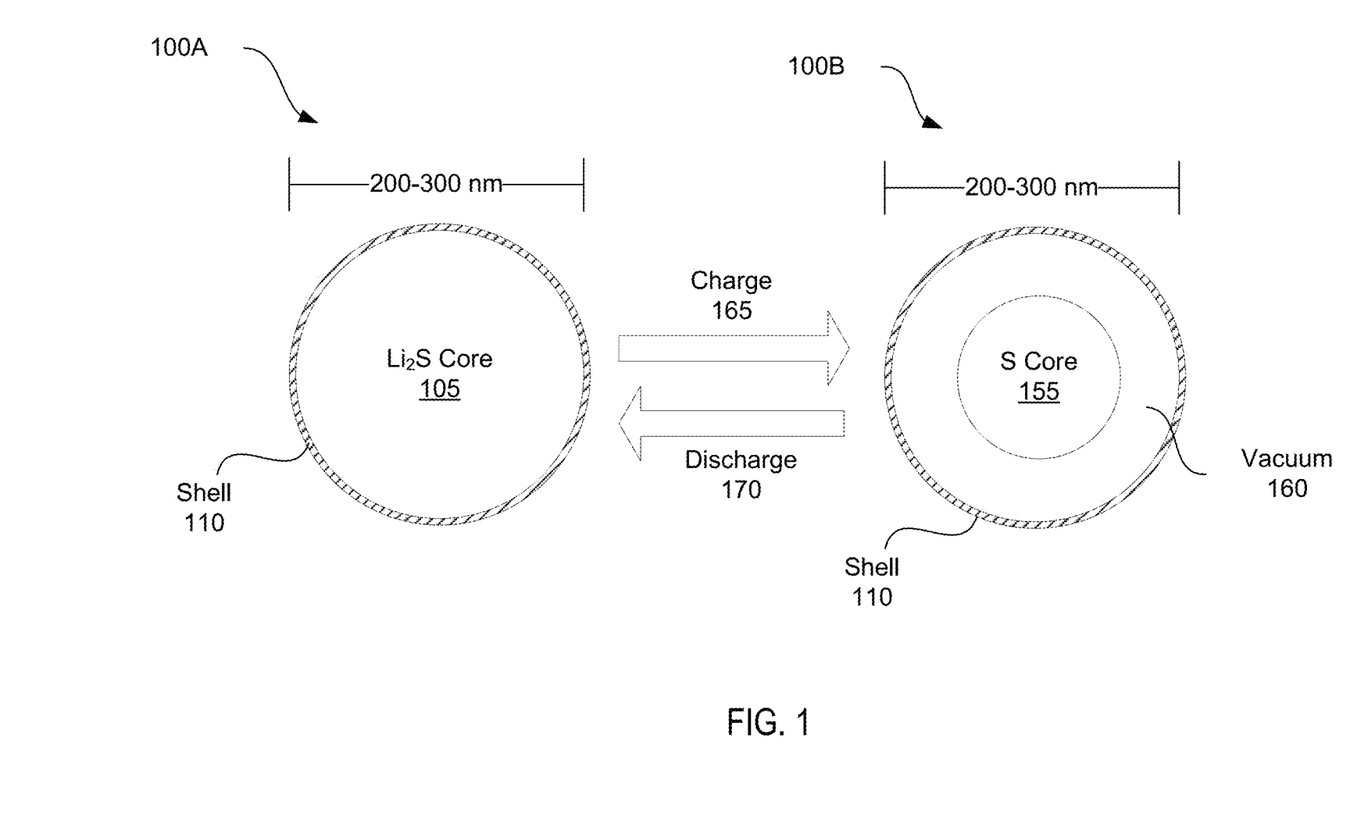
FIG. 1 illustrates two states of a core-shell nanoparticle, in accordance with one implementation of the present invention.

FIG. 1 illustrates two states of a core-shell nanoparticle, in accordance with one implementation of the present invention. The core-shell nanoparticle, in an initial synthesized state 100A, includes a lithium sulfide ($Li_2S$) nanoparticle core 105 having a size of approximately 100-300 nanometers (nm). The $Li_2S$ nanoparticle core 105 may have a spherical shape (as shown). The $Li_2S$ nanoparticle core may alternatively have other shapes, such as ovals, crystals, wires, columns, boxes, and so forth.

The core-shell nanoparticle has a thin shell 110, which may have a thickness on the scale of a few nanometers. The shell 110 prevents the $Li_2S$ nanoparticle core 105 from coming into contact with any electrolyte. Thus, the shell 110 prevents the formation of polysulfides and the migration of sulfur out of the core-shell nanoparticle. In some embodiments the shell 110 has a thickness of approximately 1-10 nm, with a thickness of about 1-2 nm in a particular embodiment. In one embodiment, the shell 110 makes up about 5-10% of the core-shell nanoparticle by weight.

The shell 110 should be electrically conductive to enable electrons to pass into and out of the $Li_2S$ nanoparticle core 105. The shell 110 should also be conductive of lithium to enable lithium atoms to pass into and out of the $Li_2S$ nanoparticle core 105. In one embodiment, the shell 110 is a carbon shell (e.g., made up of elemental carbon). In another embodiment, the shell 110 is a polymer shell. One example of a polymer that is both a lithium conductor and an electron conductor that may be used to from the shell 110 is polyaniline. In yet another embodiment, the shell 110 is a transition metal sulfide shell. One example transition metal sulfide that may be used for the shell 110 is titanium disulfide.

When the core-shell nanoparticle is used in a Li/S cell, the Li/S cell may be charged 165, which causes lithium atoms to be extracted from the core-shell nanoparticle and migrated to a negative electrode. While the Li/S cell is charged, the core-shell nanoparticle has a charged state 100B. In the charged state 100B, the core of the core-shell nanoparticle is a sulfur nanoparticle core 155. The sulfur nanoparticle core 155 may occupy a volume that is approximately 43% smaller than a volume occupied by the $Li_2S$ nanoparticle core 105. However, in some embodiments the shell 110 is a rigid shell, which does not shrink to conform to the boundaries of the sulfur nanoparticle core 155. Accordingly, the charged state 100B of the core-shell nanoparticle also includes a partial vacuum 160. The shell 110 has sufficient structural strength to approximately maintain an original shape while the core-shell nanoparticle is in the charged state 100B. Thus, the shell 110 accommodates the volume change that occurs during the charge/discharge process.

The Li/S cell may be discharged 170, which causes lithium atoms to migrate back into the core-shell nanoparticle. This causes the core of the core-shell nanoparticle to return to a $Li_2S$ nanoparticle core 105. In a transition from the sulfur nanoparticle core 155 to the $Li_2S$ nanoparticle core 105, the core grows back to approximately its original size.

Figure 2A:
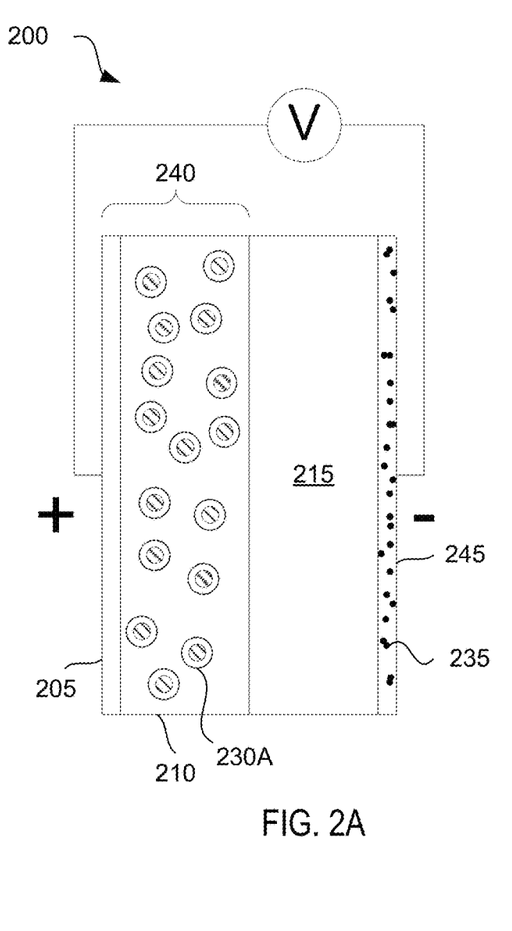
FIG. 2A illustrates a lithium-sulfur cell in a charged state, according to one implementation of the present invention.
Figure 2B:
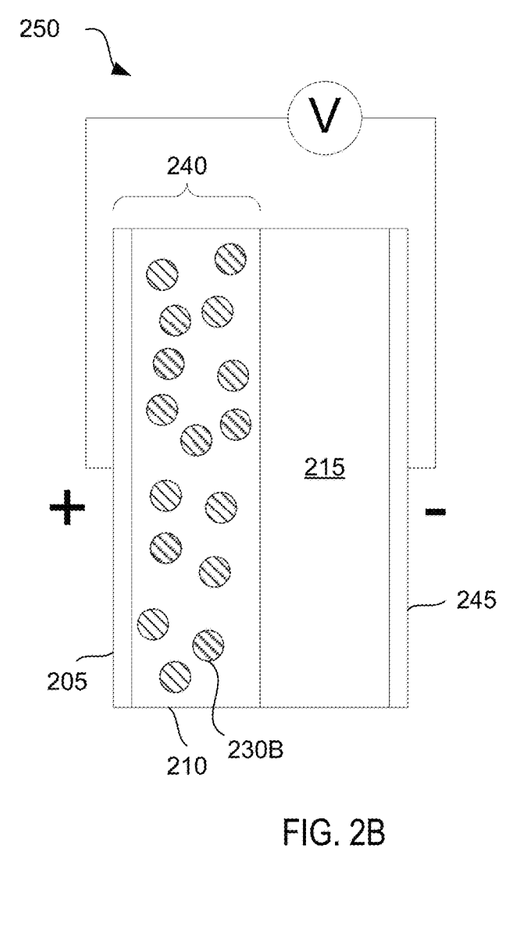
FIG. 2B illustrates a lithium-sulfur cell in an uncharged state, according to one implementation of the present invention.

FIGS. 2A-2B illustrate a Li/S cell, in accordance with one implementation of the present invention. FIG. 2A illustrates the Li/S cell in a charged state 200, while FIG. 2B illustrates the Li/S cell in an uncharged state 250.

The Li/S cell includes a positive electrode 240 and a negative electrode 245 separated by an electrolyte 215. The positive electrode 240 includes a conductor 205 and a polymer-nanoparticle nanocomposite 210. The conductor 205 may be a conductive foil, such as aluminum foil, carbon coated aluminum foil, stainless steel foil, zirconium foil, niobium foil or molybdenum foil. The polymer-nanoparticle nanocomposite 210 may include a polymer matrix of a polymer binder, with core-shell nanoparticles 230 held together by the polymer matrix. The core-shell nanoparticles 230 correspond to core-shell nanoparticle 100 of FIG. 1. In one embodiment, the polymer binder is a lithium conducting polymer. Some examples of polymer binders that may be used include polyvinylidene difluoride (PVDF), styrene butadiene rubber (SBR), polyethylene oxide (PEO), and polytetrafluoroethylene (PTFE). Other polymer binders are also possible. Additional carbon particles, carbon nanofibers, carbon nanotubes, etc. may also be dispersed in the polymer matrix to improve electrical conductivity. Additionally, a lithium salt may be dissolved in the polymer, or lithium ions may also be dispersed in the polymer matrix to improve lithium conductivity.

The negative electrode 245 may be a lithium metal foil with a copper foil current collector. Alternatively, the negative electrode 245 may be any other material capable of accepting and releasing lithium ions. Examples of materials usable for the negative electrode 245 include carbon, a tin/carbon nanocomposite, silicon nanowires, and so on.

The electrolyte 215 may be a liquid electrolyte, a solid electrolyte or a gel electrolyte. One embodiment of a solid electrolyte is poly(ethylene oxide) (PEO) with lithium salts dispersed in the polymer matrix of the PEO. An example of a gel electrolyte is a mixture of poly(methyl methacrylate) (PMMA), a lithium salt and a small amount of liquid. A liquid electrolyte may include an ionic liquid with lithium salt dissolved therein, or a mixture of an ionic liquid and an organic liquid with a dissolved lithium salt. Examples of liquids that may be used include polyethylene glycol dimethyl ether (PEG DME) or an organic solvent such as dioxolane mixed with dimethyl ether. If a liquid electrolyte is used, the electrolyte may include a porous separator such as porous poly propylene (PP). The PP may be, for example, about 25 microns thick and about 50% porous. The porous separator may absorb the liquid electrolyte. One example electrolyte includes a composition of tetraethylene glycol dimethyl ether (PEGDME) and lithium bis(trifluorosulfonyl)imide (LiTFSI). A useful ionic liquid is methyl-butyl pyridinium trifluorosulfonyl imide ($PYR_{14}TFSI$). The electrolyte may also include lithium bis(trifluoromethanesulfonyl)imide (LiTFSI) and/or lithium nitrate ($LiNO_3$). In one example, the electrolyte has a 1:1 ratio by weight of $PYR_{14}TFSI$ and PEGDME, with 1 mol/kg LiTFSI.

As shown in FIG. 2A, while the Li/S cell is charged, lithium ions 235 are in the negative electrode 245. Additionally, the core-shell nanoparticles 230 have a charged state 230A that includes a sulfur nanoparticle core. As shown in FIG. 2B, when the Li/S cell is discharged, the ions leave the negative electrode 245 and migrate through the electrolyte 215 to the positive electrode 240. In the positive electrode 240, the ions react with the sulfur nanoparticles in the core-shell nanoparticles to convert the sulfur nanoparticles into $Li_2S$ nanoparticles, causing the core-shell nanoparticles 230 to have an uncharged (discharged) state 230B.

Figure 3:
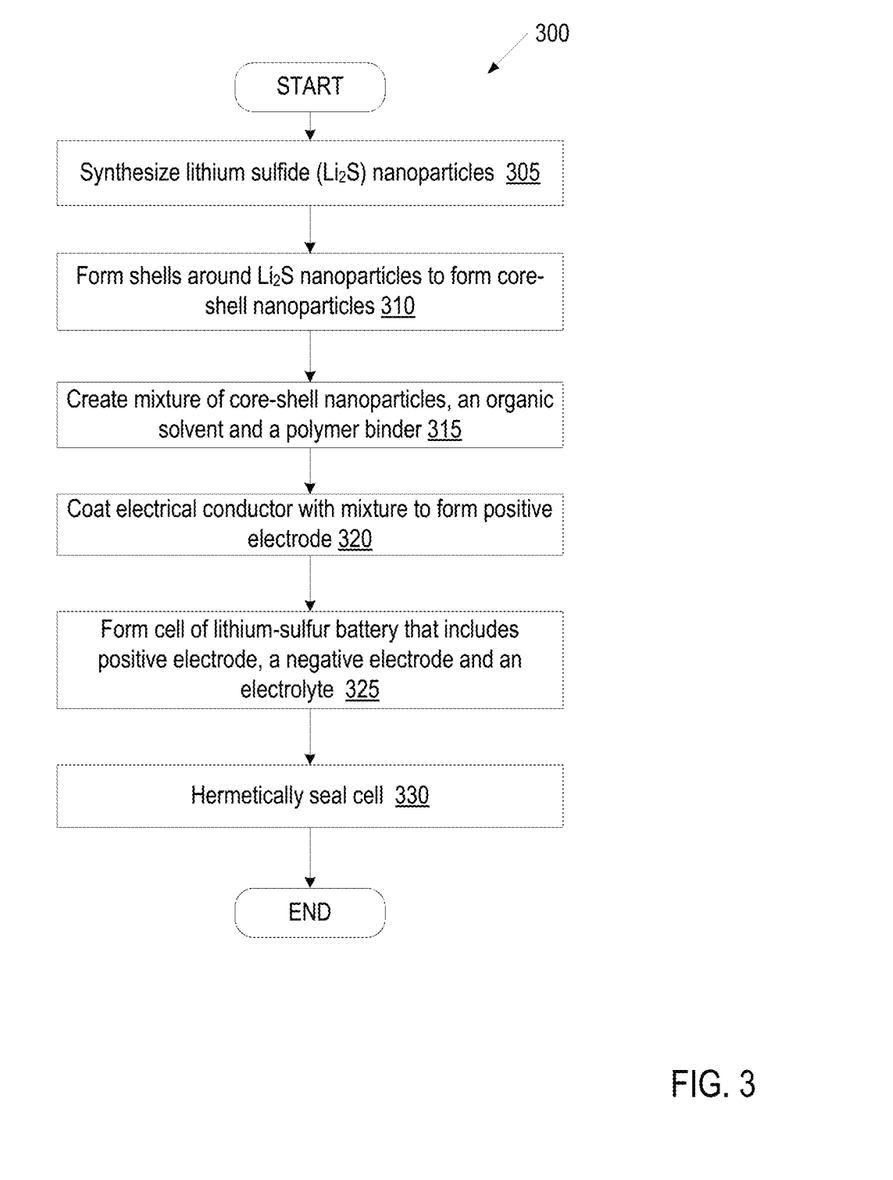
FIG. 3 is a flow chart illustrating a method of manufacturing a lithium/sulfur cell having core-shell nanoparticles in a positive electrode of the lithium sulfur cell, in accordance with one implementation of the present invention.

FIG. 3 is a flow chart illustrating a process 300 of manufacturing a lithium/sulfur cell having core-shell nanoparticles in a positive electrode of the lithium/sulfur cell, in accordance with one implementation of the present invention. At block 305 of process 300, $Li_2S$ nanoparticles are synthesized. Two methods for synthesizing $Li_2S$ nanoparticles are described below with reference to FIG. 4A and FIG. 4B. Alternatively, micro or bulk state $Li_2S$ particles may be mechanically milled (e.g., ball milled) to reduce particle sizes of the $Li_2S$ particles down to nanoscale particles. Such mechanical milling should be performed under an argon atmosphere or in the presence of another neutral (inert) gas.

At block 310 of process 300, shells are formed around the $Li_2S$ nanoparticles to form core-shell nanoparticles. The shells are nano-scale shells having thicknesses on the order of a few nanometers. Thicker shells may be used in some embodiments, which increases the weight of the core-shell nanoparticles. The shells are composed of materials that conduct both electrons and lithium ions, and that will act as a barrier between the Li$_2$S nanoparticle core and an external environment. Thus, the shell may block the Li$_2$S nanoparticle core from coming into contact with the electrolyte and prevent sulfur from the Li$_2$S nanoparticle core to escape in the form of polysulfides. Examples of materials that may be used to form the shells around the Li$_2$S nanoparticles include carbon, transition metal sulfides and polyaniline Methods for forming shells around Li$_2$S nanoparticles are described below with reference to FIG. 5 and FIG. 6.

At block 315 of process 300, a mixture is created from the core-shell nanoparticles, an organic solvent and a polymer binder. In one embodiment, the core-shell nanoparticles are added to a solution that includes the organic solvent and the polymer binder. In another embodiment, the core-shell nanoparticles are added to the organic solvent and polymer binder to form a slurry. The slurry and solution may be composed of the same constituents, but have different proportions of the organic solvent to the other constituents. The organic solvent may be, for example, toluene. The polymer binder may be PVDF, SBR, PTFE, and so on. In one embodiment, carbon, carbon nanofibers, and/or other conductive agents are added to the solution or slurry to improve the electronic conductivity of the resultant film.

At block 320, an electrical conductor such as a conductive foil (e.g., aluminum foil) is coated with the slurry or solution to form a film on the electrical conductor. The thickness of the film may range from a few microns to tens of microns (e.g., 2-99 microns). In one embodiment, the film has a thickness of 10-50 microns. The electrical conductor and film may be used as a positive electrode for a Li/S cell. Increasing the thickness of the film increases the percentage of active core-shell nanoparticles to other constituents by weight, and may increase Li/S cell capacity. However, diminishing returns may be exhibited beyond certain thicknesses (e.g., beyond several tens of microns). In one embodiment, the film has a thickness of between 5 and 200 microns. In a further embodiment, the film has a thickness of between 10 and 100 microns.

Various coating techniques may be used to apply the solution or slurry to the electrical conductor. Examples of such techniques include a doctor blade process, spin coating, extrusion, spray coating, dip coating, and so on. In addition, large-scale production techniques such as ink jet printing may also be used to deposit the solution or slurry onto the electrical conductor.

At block 325, a Li/S battery cell is formed using the positive electrode, an electrolyte and a negative electrode. The electrolyte is used to separate the positive electrode and the negative electrode, and to provide an ionically-conductive path of the Li ions. The electrolyte may have a solid, gel or liquid state. Regardless of the electrolyte's state, the electrolyte should be a lithium ion conductor. The electrolyte may include a dissolved lithium salt to improve lithium conduction. Where a liquid electrolyte is used, the liquid electrolyte may be soaked into a porous separator such as porous PP. The electrolyte may be approximately 10-50 microns thick, and in one embodiment has a thickness of about 25 microns. One example electrolyte includes a composition of tetraethylene glycol dimethyl ether (TEGDME) and PYR$_{1,4}$TFSI, along with a lithium salt such as LiTFSI. The electrolyte may also include lithium nitrate (LiNO$_3$).

Figure 4A:
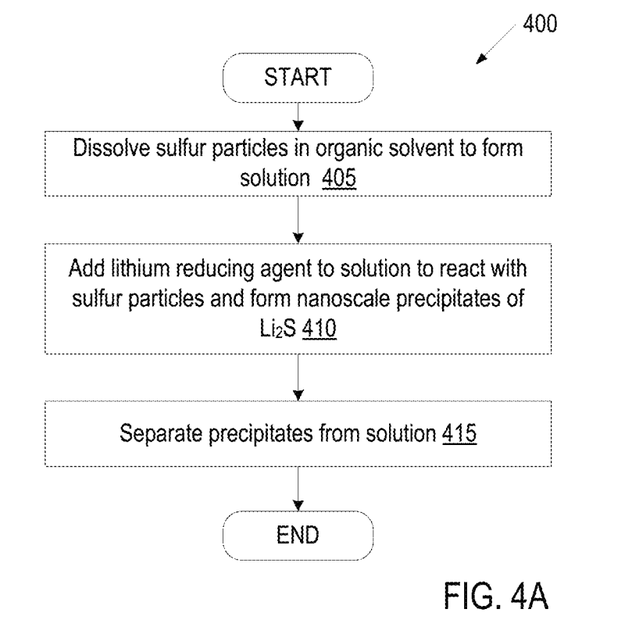
FIG. 4A is a flow chart illustrating one embodiment for a method of synthesizing lithium sulfide nanoparticles.

At block 330, the Li/S cell is hermetically sealed. This prevents unwanted exposure to the atmosphere, which may cause the Li$_2$S nanoparticles to react with moisture in the air to form lithium oxide and lithium hydroxide. After sealing the Li/S cell undergoes an initial charge up to a specified end-of-charge voltage, which may be in the range of 2.8V to about 4V over an extended time period (e.g., up to about 50 hours). This initial charge causes microstructuring in the positive electrode in accordance with changing operating conditions of the Li/S cell. Subsequently, the Li/S cell may be discharged down to about 1.5 V in about 5 hours. The cell may then be charged and discharged between voltages of about 2.8V at the charged state and 1.5 V at the discharged state. Such charging and discharging may occur over various time periods ranging from a fraction of an hour to tens of hours FIG. 4A is a flow chart illustrating one embodiment for a method 400 of synthesizing lithium sulfide nanoparticles. At block 405 of method 400, sulfur particles are dissolved in an organic solvent to form a solution. Examples of organic solvents that may be used include hexane, toluene, benzene, ethanol, dioxane, heptane, tetrahydrofuran (THF), and so forth. At block 410, a lithium reducing agent is added to the solution to react with the sulfur particles. The reaction between the lithium reducing agent and the sulfur particles forms nanoscale precipitates of Li$_2$S. Examples of lithium reducing agents that may be used include lithium triethylborohydride (lithium super hydride) and n-butyl lithium. In one embodiment, a surfactant is added to the solution before or after adding the lithium reducing agent to prevent the formation of larger aggregated particles. At block 415, the Li$_2$S precipitates are separated from the solution using a centrifuge. If lithium superhydride (LiET$_3$BH) is used as the reducing agent, then the chemical reaction that produces Li$_2$S nanoparticles is:

$$S + 2LiET_3BH \rightarrow Li_2S + ET_3B + H_2 \quad (1)$$

Figure 4B:
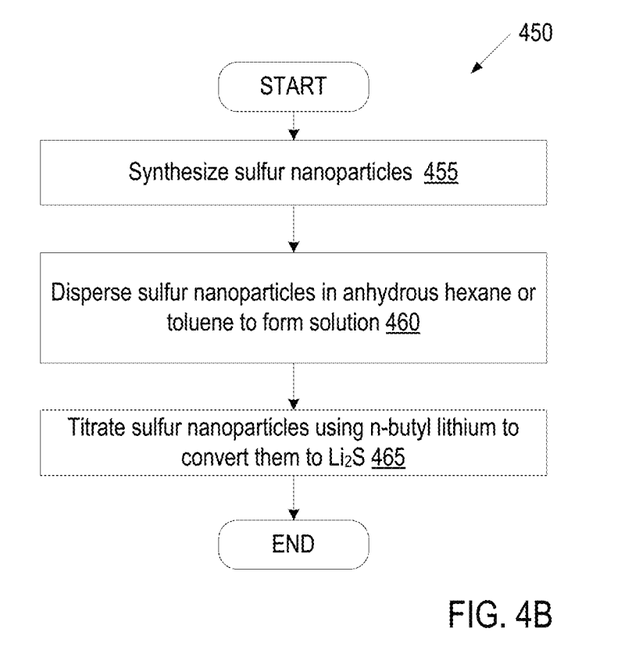
FIG. 4B is a flow chart illustrating another embodiment for a method of synthesizing lithium sulfide nanoparticles.

FIG. 4B is a flow chart illustrating another embodiment for a method 450 of synthesizing lithium sulfide nanoparticles. At block 455, sulfur nanoparticles are synthesized or provided. Sulfur nanoparticles may be synthesized by performing precipitation from polysulfide solutions, microemulsion procedures, precipitation from supersaturated sulfur solutions or other sulfur nanoparticle synthesis techniques. At block 460, the sulfur nanoparticles are dispersed in anhydrous hexane or toluene. At block 465, the sulfur nanoparticles are titrated using n-butyl lithium to convert them to Li$_2$S nanoparticles, which may then be separated from the solution.

Figure 5:
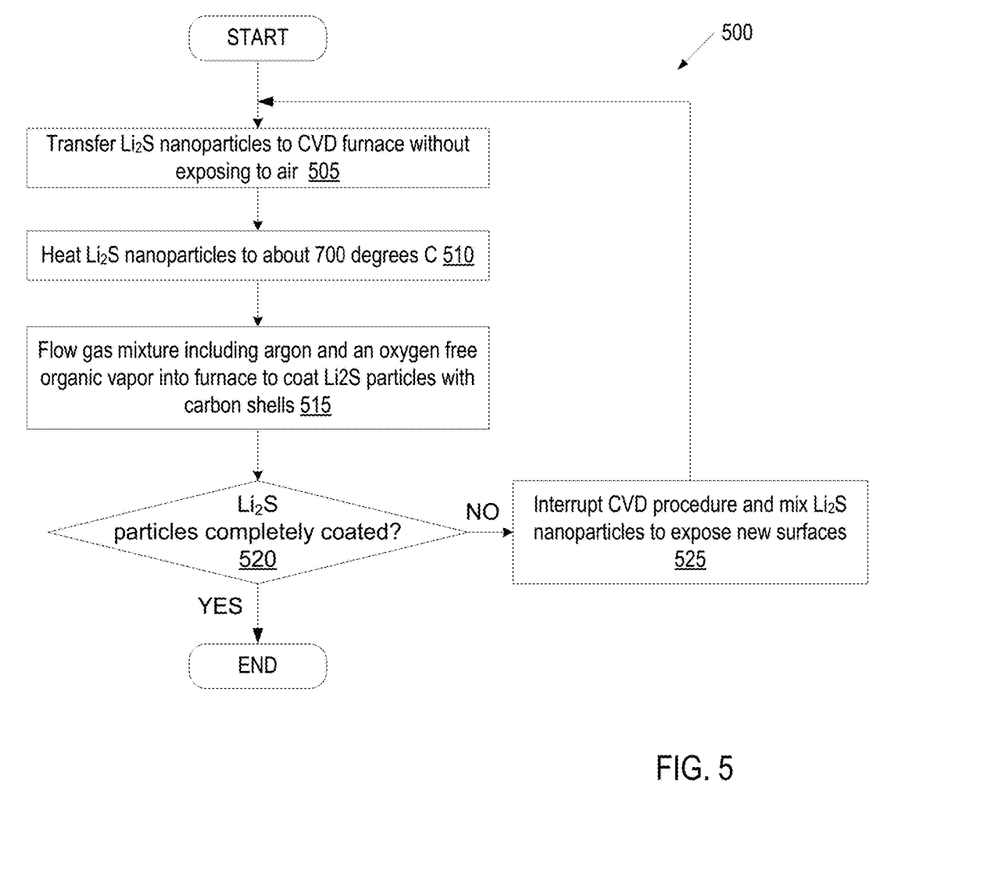
FIG. 5 is a flow chart illustrating one embodiment for a method of forming carbon shells around lithium sulfide nanoparticles.

FIG. 5 is a flow chart illustrating one embodiment for a method 500 of forming carbon shells around lithium sulfide nanoparticles by performing pyrolysis. At block 505 of method 500, Li$_2$S nanoparticles are transferred to a chemical vapor deposition (CVD) furnace without exposing the Li$_2$S nanoparticles to air. For example, the Li$_2$S nanoparticles may be stored and transported in a sealed container containing argon gas. In one embodiment, the Li$_2$S nanoparticles are transferred into a glovebox filled with argon, and transferred to a ceramic boat, which may be placed in a quartz tube. The quartz tube may be sealed, transferred out of the glove box, and placed in the CVD furnace. The CVD furnace, including all tubes and feeds, may be flushed with argon gas before connecting the quartz tube to the furnace. After connecting, a steady gas flow of argon may be applied (e.g., around 150 standard cubic centimeters (SCCM)).

At block 510, the CVD furnace (and the Li$_2$S nanoparticles therein) is heated. The temperature to which the furnace is heated may depend on the organic vapor that is used for the CVD process. If acetylene is to be used as a carbon precursor, then the furnace may be heated to about 400° C. If ethylene is used as the carbon precursor, then the furnace may be heated to about 700° C. If methane is used as the carbon precursor, then the furnace may be heated to about 800° C. A flow rate of about 50 SCCM may be used for the organic vapor. A lower temperature may prevent sintering of $Li_2S$ nanoparticles. $Li_2S$ particle size may affect sintering. For example, use of smaller $Li_2S$ particles may increase sintering. Accordingly, optimized coating conditions may be a function of the gas precursor used, temperature, time, and $Li_2S$ nanoparticle size.

At block 515, a gas mixture of argon and an oxygen free organic vapor are flowed into the CVD furnace. Examples of organic vapors that may be used include acetylene, methane and ethylene. Note that it is preferable that the organic vapor not decompose into products that include water.

The organic vapor is a carbon source. In the heated state, the oxygen-free organic vapor reacts via pyrolysis with surfaces of the $Li_2S$ nanoparticles to form carbon shells around the exposed portions of the $Li_2S$ nanoparticles.

At block 520, it is determined whether the $Li_2S$ nanoparticles are completely coated by carbon. This may be performed by a visual inspection, because uncoated $Li_2S$ nanoparticles have an off-white color and carbon coated $Li_2S$ nanoparticles have a black color. Accordingly, if any white is visible, then it can be determined that the $Li_2S$ nanoparticles are not completely coated. Experimentation has shown that the $Li_2S$ nanoparticles that are remixed 2-3 times during the CVD process will be completely coated. Accordingly, it may be determined whether the $Li_2S$ nanoparticles are sufficiently coated based on a number of times that the $Li_2S$ nanoparticles have been mixed. For example, if the $Li_2S$ nanoparticles have been mixed fewer than 2 times, then it may be determined that the $Li_2S$ nanoparticles are not completely coated. If the $Li_2S$ nanoparticles are not completely coated, the method proceeds to block 525. Otherwise, the method ends, and the resultant core-shell nanoparticles of carbon coated $Li_2S$ nanoparticles are removed from the CVD furnace.

At block 525, the CVD process is interrupted, and the $Li_2S$ nanoparticles are mixed to expose new surfaces of the $Li_2S$ nanoparticles. Alternatively, the $Li_2S$ nanoparticles may be mixed in-situ during the CVD process. The method then returns to block 505, and is repeated until all surfaces of the $Li_2S$ nanoparticles are coated. Note that if the $Li_2S$ nanoparticles are mixed in-situ, then the method may return to block 520 rather than to block 505. Alternatively, a rotating tube furnace can be used, whereby all of the particles are tumbled during the CVD procedure, so that all of the surface of all of the particles are covered by the carbon coating.

Figure 6:
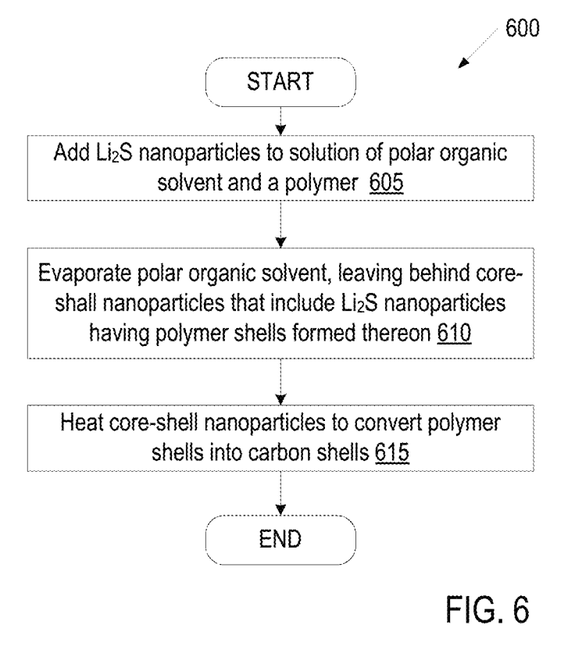
FIG. 6 is a flow chart illustrating one embodiment for a method of forming polymer shells and/or carbon shells around lithium sulfide nanoparticles.

FIG. 6 is a flow chart illustrating one embodiment for a method 600 of forming polymer shells and/or carbon shells around lithium sulfide nanoparticles. At block 605 of method 600, $Li_2S$ nanoparticles are added to a solution of an organic solvent and a polymer. The polymer may be an electronic conductor such as polyaniline. The polyaniline (or other polymer) forms shells around the $Li_2S$ nanoparticles.

At block 610, the organic solvent is evaporated, leaving behind core-shell nanoparticles that include $Li_2S$ nanoparticle cores having polymer shells formed thereon. In some embodiments, method 600 terminates after completion of block 610. For example, some polymers such as polyaniline may form shells that are electronic conductors and lithium ion conductors, and that will block transmission of polysulfides. In alternative embodiments, method 600 continues to block 615.

At block 615, the core-shell nanoparticles are heated. By heating the core-shell nanoparticles, the polymer shell may be converted into a carbon shell. In one embodiment, the core-shell nanoparticles are heated to a temperature of about 400-500 degrees centigrade.

In one embodiment, a transition metal sulfide shell may be formed around the $Li_2S$ nanoparticles. For example, $TiS_2$ may be formed around $Li_2S$ nanoparticles by reacting titanium tetrachloride with the $Li_2S$ nanoparticles to from a $TiS_2$ coating around the $Li_2S$ nanoparticles.

Figure 7:
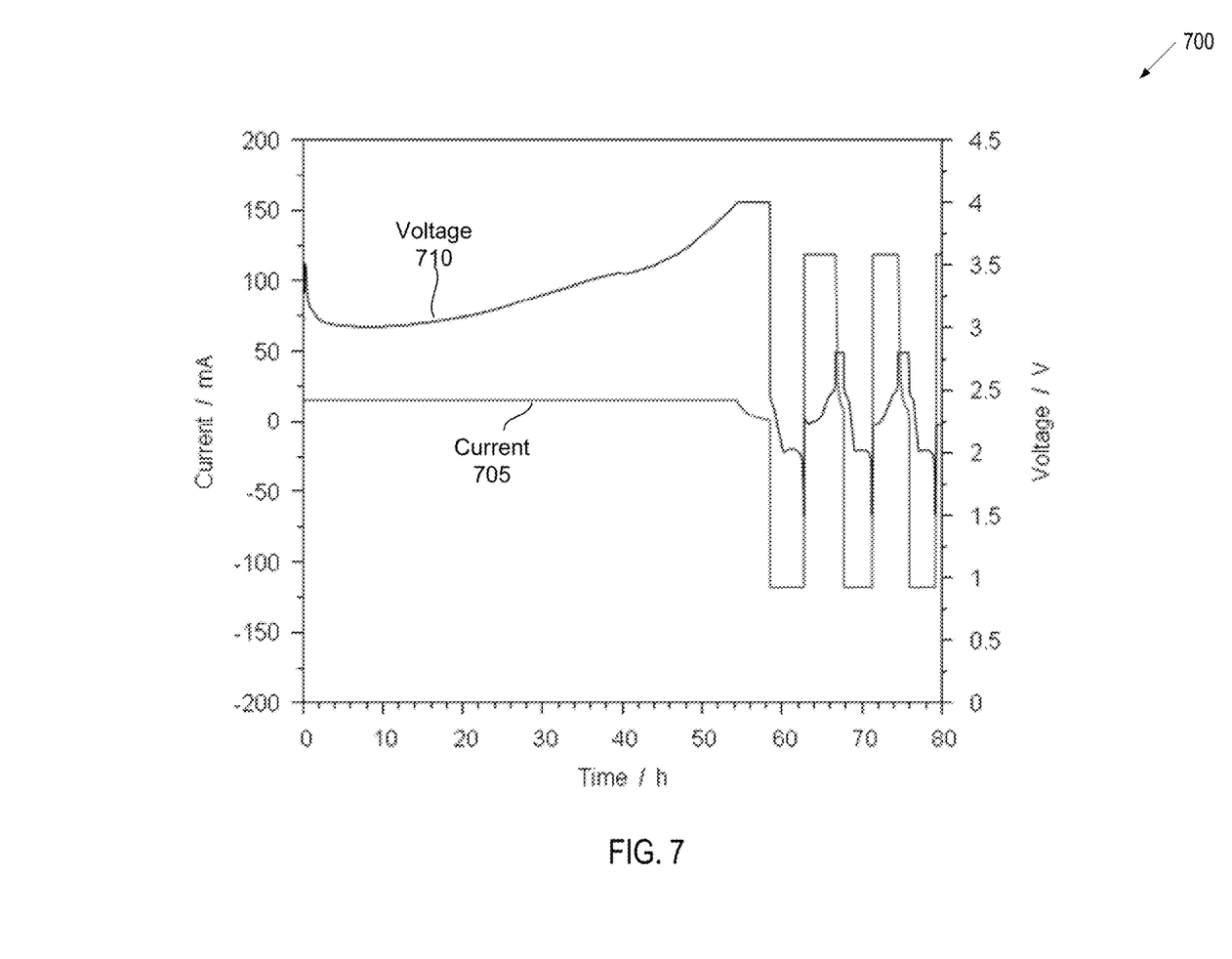
FIG. 7 is a plot of current and voltage vs. time during charging and discharging of a lithium/sulfur cell manufactured in accordance with embodiments of the present invention.

FIG. 7 is a plot 700 of current and voltage vs. time during charging and discharging of a lithium/sulfur cell manufactured in accordance with embodiments of the present invention. As shown, at time 0 a current 705 of approximately 15 micro amps is applied to the Li/S cell. The 15 micro amp current 705 is applied to the Li/S cell for approximately 50 hours, causing a voltage 710 to steadily increase to approximately 4V. After an initial charge to 4V, a negative (discharge) current of approximately −120 micro amps is applied to the Li/S cell, discharging the Li/S cell and causing the voltage 710 for the Li/S cell to drop to about 1.5V at approximately 62 hours. A positive (charging) current of approximately 120 micro amps is then applied to the Li/S cell to charge the cell and cause the voltage 710 to increase to approximately 2.8V. The Li/S cell is then cycled through additional discharges and charges. Each discharge may take about 5 hours and each additional charge may take about 5 hours.

Figure 8:
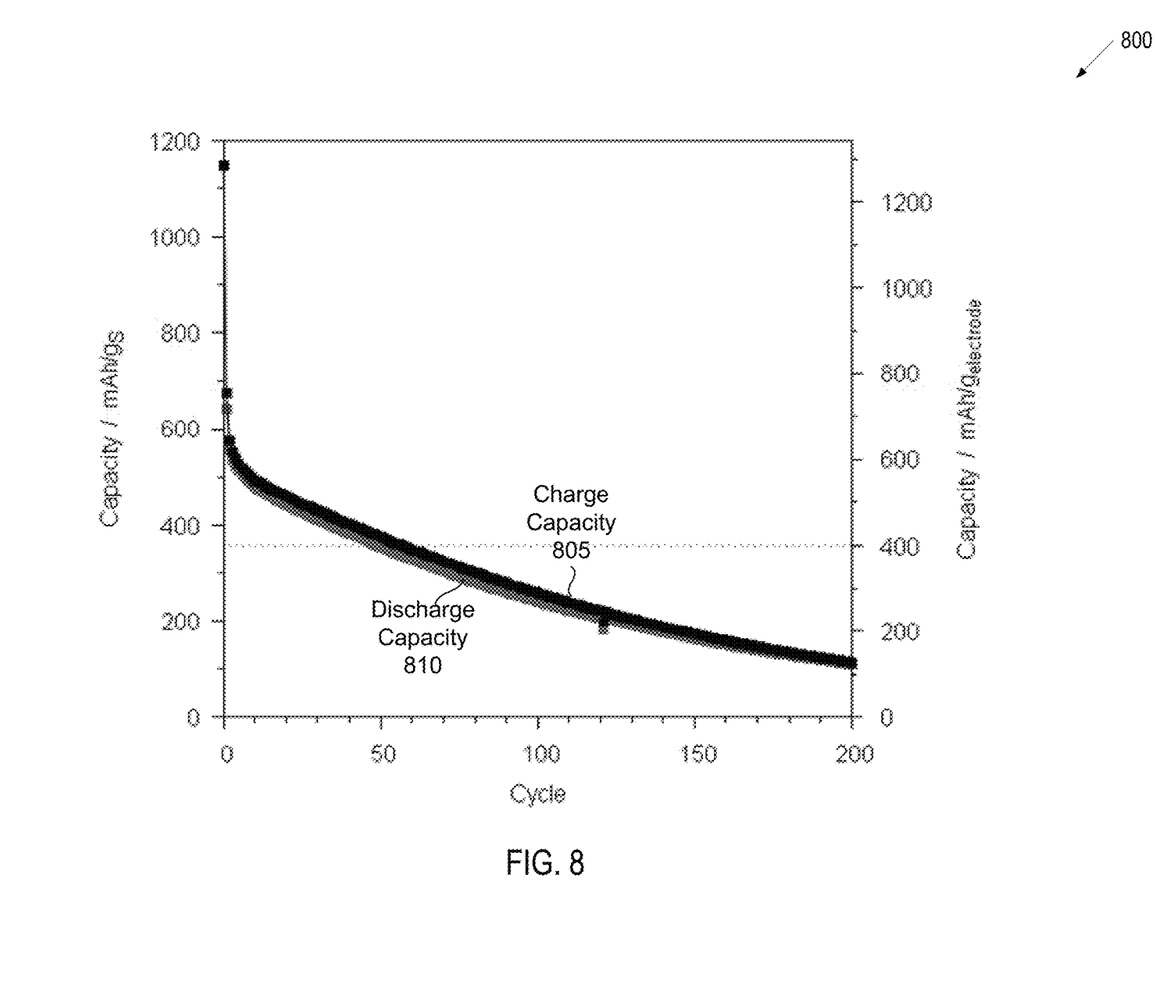
FIG. 8 is a plot of charge capacity and discharge capacity over cycles of a lithium/sulfur cell manufactured in accordance with embodiments of the present invention.

FIGS. 8-11 are plots of charge capacity and discharge capacity over cycles of lithium/sulfur cells manufactured in accordance with embodiments of the present invention. FIG. 8 is a plot 800 that shows a charge capacity 805 and a discharge capacity 810 for an example Li/S cell. The example Li/S cell has a mass loading of the electrode mixture of 0.133 mg/cm². The mass loading represents the amount of polymer-nanoparticle nanocomposite per square centimeter of conductor (e.g., aluminum foil) that is coated. A higher mass loading means that a greater percentage of the Li/S cell's mass is made up of active material (e.g., the polymer-nanoparticle nanocomposite). The polymer-nanoparticle nanocomposite for the example Li/S cell has a composition of 68% core-shell nanoparticles, 23% carbon (C65), and 9% polymer binder (SBR). The polymer-nanoparticle composite used in the illustrated example includes core-shell nanoparticles with an $Li_2S$ core and a carbon shell. An electrolyte used to form the Li/S cell is a composition of 66% tetraethylene glycol dimethyl ether (TEGDME), 33% 1-methyl,1-butyl pyridinium TFSI ($PYR_{1,4}TFSI$), 1 molar lithium bis(trifluoromethanesulfonyl)imide (LiTFSI) and 0.1 molar lithium nitrate ($LiNO_3$).

Plot 800 shows charge capacity 805 and discharge capacity 810 during 200 charge/discharge cycles of the Li/S cell. A first charge may be a charge to 4V at a rate of 0.02 C (50 hours to full charge). Subsequent charges may be to 2.8V at 0.2 C (5 hours), and discharges may be to 1.5V at 0.2 C (5 hours). As shown, the charge capacity 805 and discharge capacity 810 started at around 600 mAh/g S and gradually decreased with time to around 200 mAh/g S. This indicates that a complete shell was likely not formed over the $Li_2S$ nanoparticles used to form the positive electrode.

Figure 9:
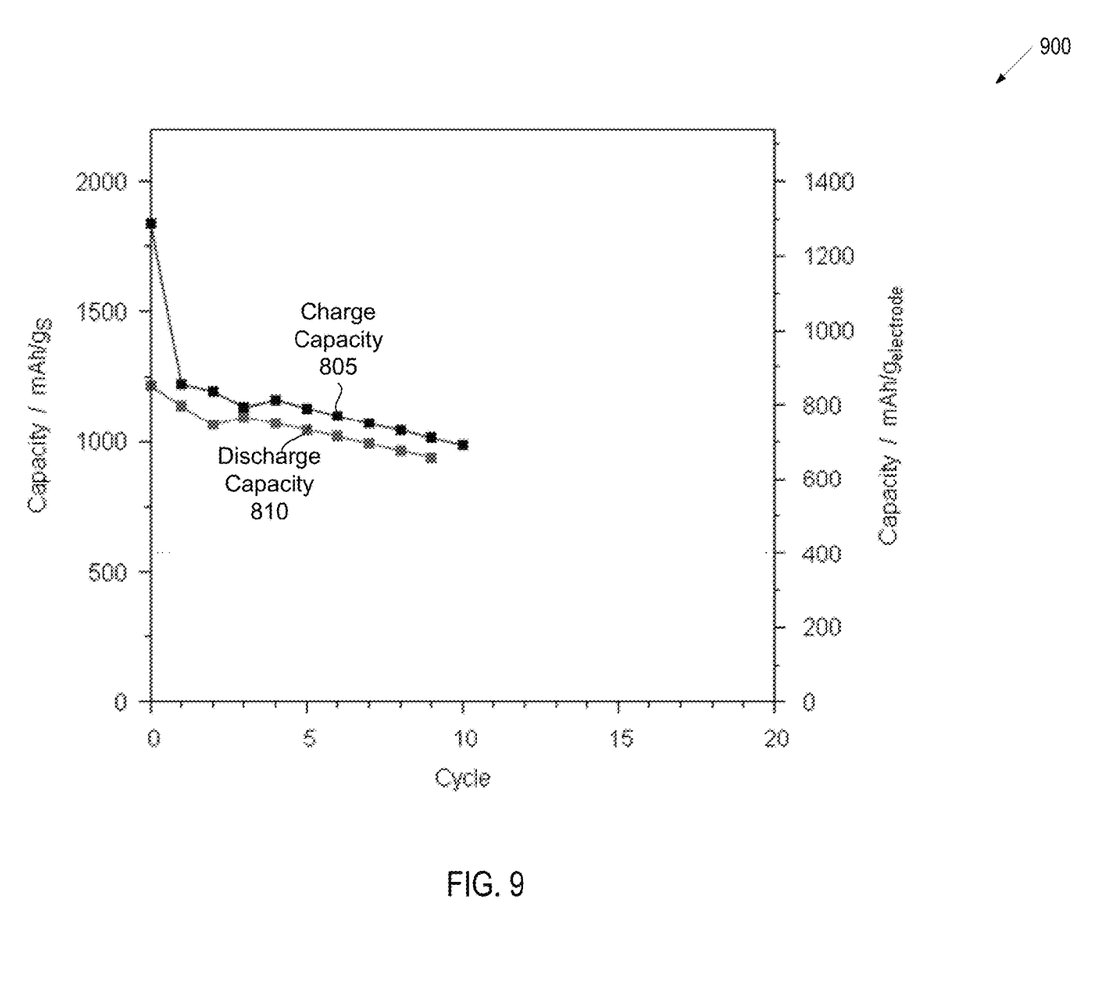
FIG. 9 is a plot of charge capacity and discharge capacity over cycles of a lithium/sulfur cell manufactured in accordance with embodiments of the present invention.

FIG. 9 is a plot 900 that shows a charge capacity 905 and a discharge capacity 910 for another example Li/S cell. The example Li/S cell has a mass loading of 1.31 mg/cm². The polymer-nanoparticle nanocomposite for the example Li/S cell has a composition of 80% core-shell nanoparticles, 14% carbon (C65), and 6% polymer binder (SBR). The polymer-nanoparticle composite used in the illustrated example includes core-shell nanoparticles with an $Li_2S$ core and a carbon shell. An electrolyte used to form the Li/S cell is a composition of 66% TEGDME, 33% PYR$_{14}$TFSI, 1 molar LiTFSI and 0.3 molar LiNO$_3$.

Plot 900 shows charge capacity 905 and discharge capacity 910 after 10 charge/discharge cycles of the Li/S cell. A first charge may be a charge to 4V at a rate of 0.02 C. Subsequent charges may be to 2.8V at 0.2 C, and discharges may be to 1.5V at 0.2 C. As shown, the charge capacity 905 and discharge capacity 910 started at around 1200 mAh/g S and gradually decreased with time to around 1000 mAh/g S after 10 cycles. These capacities are very high, and compare to about 150-200 mAh/g for lithium ion cell cathode materials.

Figure 10:
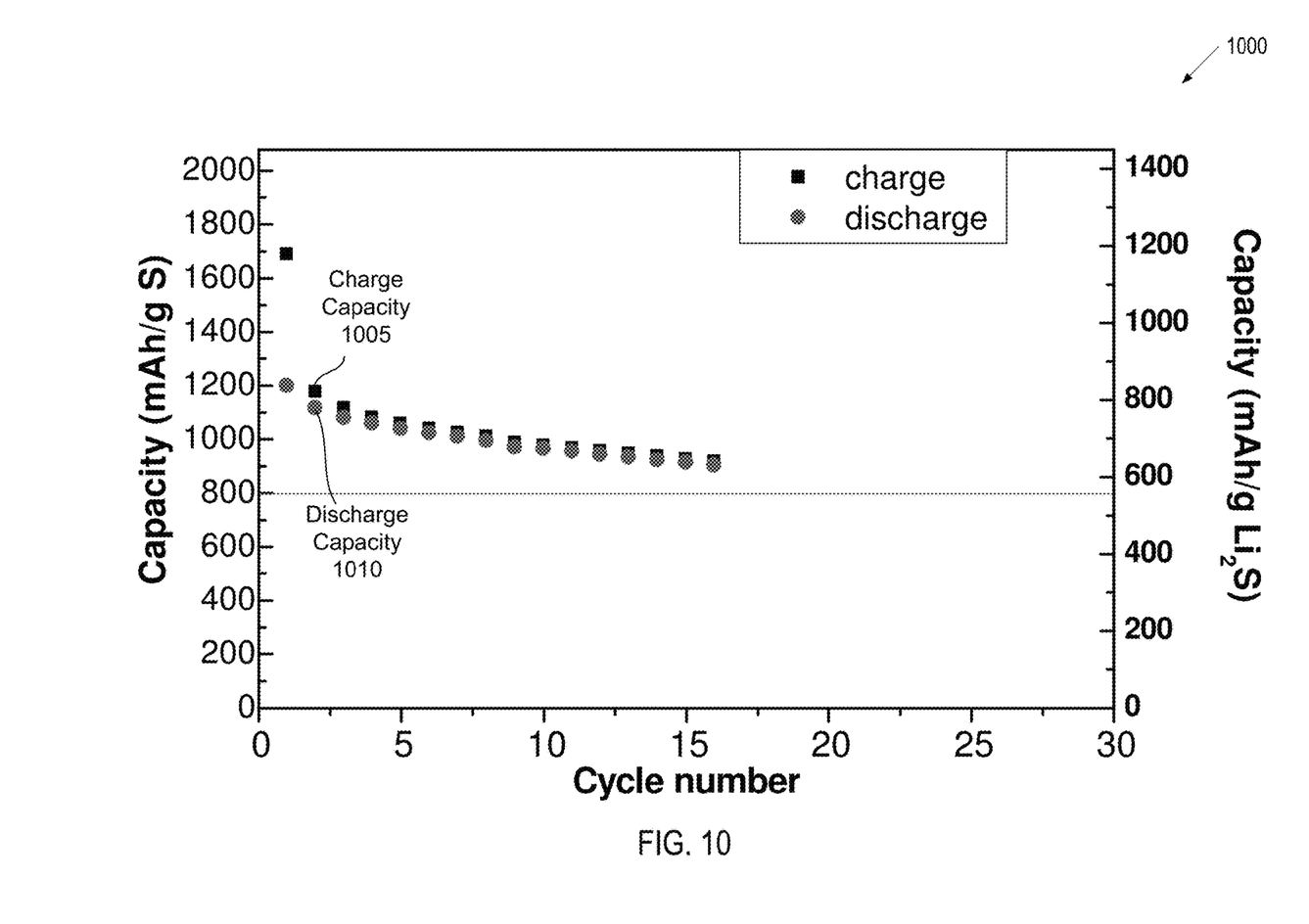
FIG. 10 is a plot of charge capacity and discharge capacity over cycles of a lithium/sulfur cell manufactured in accordance with embodiments of the present invention.

FIG. 10 is a plot 1000 that shows a charge capacity 1005 and a discharge capacity 1010 for another example Li/S cell. The example Li/S cell has a mass loading of 0.73 mg/cm$^2$. The polymer-nanoparticle nanocomposite for the example Li/S cell has a composition of 73.5% core-shell nanoparticles, 20% conducting agent (e.g., Denka Black (DB), a carbon sold by the Denka® company), and 6.5% polymer binder (SBR). The polymer-nanoparticle composite used in the illustrated example includes core-shell nanoparticles with an Li$_2$S core and a titanium disulfide (TiS$_2$) shell. In one embodiment, the composition of the core-shell nanoparticles is approximately 92% Li$_2$S and 8% TiS$_2$. An electrolyte used to form the Li/S cell is a composition of PYR$_{14}$TFSI, LiTFSI, 1,3-dioxolane (DOL)/dimethoxy ethane (DME) and LiNO$_3$.

Plot 1000 shows charge capacity 1005 and discharge capacity 1010 after 16 charge/discharge cycles of the Li/S cell. A first charge may be a charge to 4V at a rate of 0.02 C. Subsequent charges may be to 2.8V at 0.1 C, and discharges may be to 1.5V at 0.1 C. As shown, the charge capacity 1005 and discharge capacity 1010 started at around 1200 mAh/gs and gradually decreased with time to around 1000 mAh/gs after 16 cycles.

Figure 11:
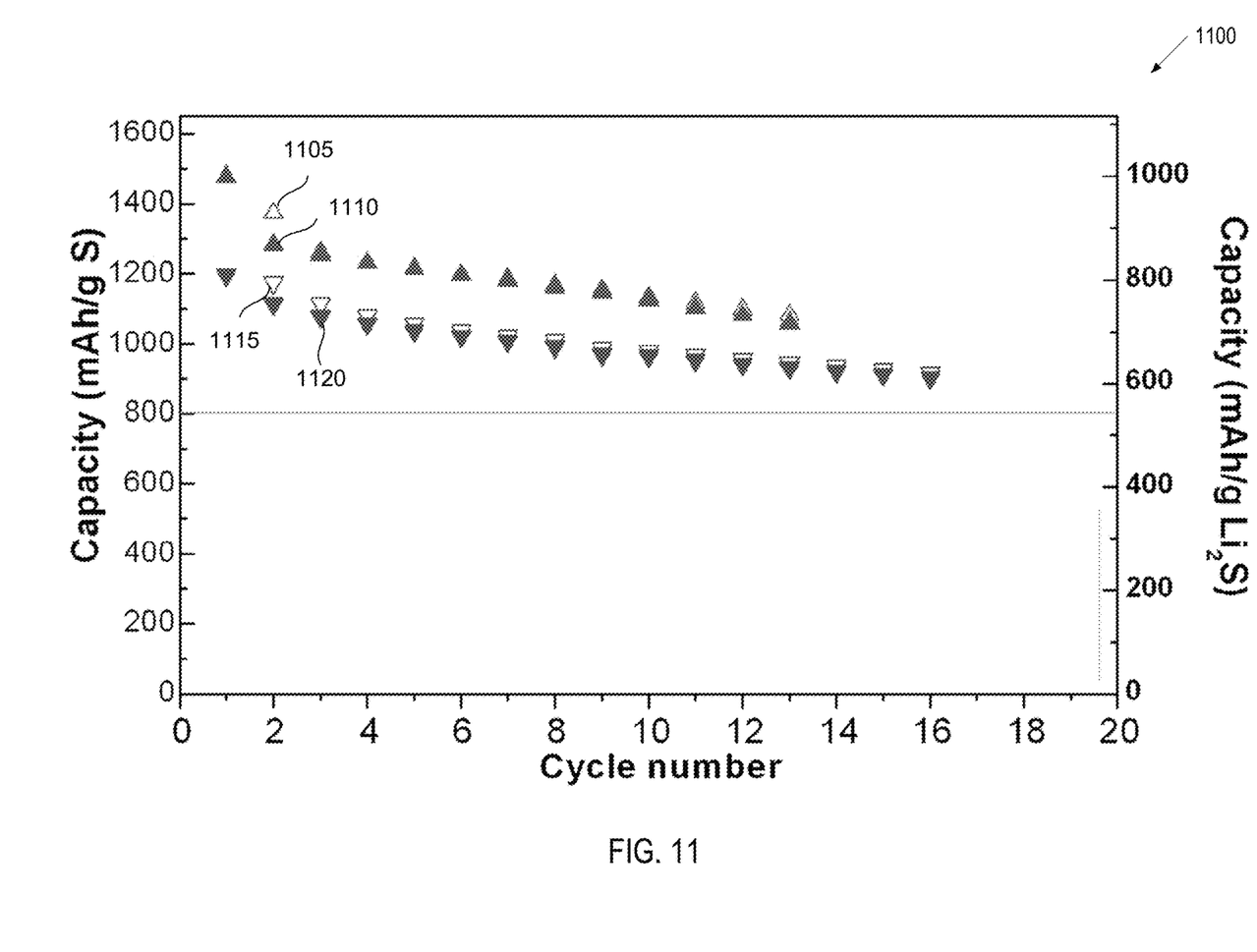
FIG. 11 is a plot of charge capacity and discharge capacity over cycles of a lithium/sulfur cell manufactured in accordance with embodiments of the present invention.

FIG. 11 is a plot of the charge capacity and discharge capacity over cycles of two lithium/sulfur cells manufactured in accordance with embodiments of the present invention. A charge capacity 1105 and discharge capacity 1110 of a Li/S cell having a positive electrode with core-shell nanoparticles that include TiS$_2$ shells is compared to a charge capacity 1115 and a discharge capacity 1120 of a Li/S cell having a positive electrode with core-shell nanoparticles that include carbon shells. As shown, the charge capacity 1105 and discharge capacity 1110 for the Li/S cell with TiS$_2$ shells stabilizes at around 1200 mAh/g S. The charge capacity 1105 and discharge capacity 1110 for the Li/S cell with carbon shells stabilizes at around 1000 mAh/g S. These data represent very high performance, consistent with a cell that delivers 400-500 Wh/kg, compared to 150-200 Wh/kg for Li ion cells.

The above examples are provided to illustrate embodiments of the present invention but not to limit its scope. Other variants of the invention will be readily apparent to one of ordinary skill in the art. The scope of the invention should, therefore, be determined with reference to the appended claims, along with the full scope of equivalents to which such claims are entitled.

What is claimed is:

1. A positive electrode for a lithium-sulfur cell, the positive electrode comprising a plurality of core-shell nanoparticles, each core-shell nanoparticle comprising:
    a single non-hollow lithium sulfide nanoparticle core; and
    a single shell contacting the entire external surface of the single non-hollow lithium sulfide nanoparticle core, the single shell comprising a transition metal sulfide.

2. The positive electrode of claim 1, wherein each core-shell nanoparticle has a size of approximately 200-300 nanometers.

3. The positive electrode of claim 2, wherein each respective single non-hollow lithium sulfide nanoparticle core is convertible into a single sulfur nanoparticle core having a reduced size compared to the size of the respective single non-hollow lithium sulfide nanoparticle core, and wherein each core-shell nanoparticle retains the size of approximately 200-300 nanometers after the respective single non-hollow lithium sulfide nanoparticle core is converted into the single sulfur nanoparticle core.

4. The positive electrode of claim 1, wherein a thickness of each respective single shell is approximately 1-10 nanometers.

5. The positive electrode of claim 4, wherein a thickness of each respective single shell is approximately 1-2 nanometers.

6. The positive electrode of claim 1, wherein each respective single shell is a titanium disulfide shell.

7. The positive electrode of claim 6, wherein each respective single shell is formed by reacting the respective single non-hollow lithium sulfide nanoparticle core with titanium tetrachloride.

* * * * *